United States Patent
Ealey et al.

(10) Patent No.: US 7,492,077 B2
(45) Date of Patent: Feb. 17, 2009

(54) ACTUATOR FOR DEFORMABLE OPTICAL COMPONENT

(75) Inventors: Mark A. Ealey, Littleton, MA (US); Paul A. Davis, Lancaster, MA (US); Jeffrey L. Cavaco, Boylston, MA (US)

(73) Assignee: Xinetics, Inc., Devens, MA (US)

( * ) Notice: Subject to any disclaimer, the term of this patent is extended or adjusted under 35 U.S.C. 154(b) by 254 days.

(21) Appl. No.: 11/129,589

(22) Filed: May 13, 2005

(65) Prior Publication Data

US 2006/0255687 A1 Nov. 16, 2006

(51) Int. Cl.
*H01L 41/047* (2006.01)
*H01L 41/08* (2006.01)

(52) U.S. Cl. .................. 310/365; 310/363; 310/364; 310/366

(58) Field of Classification Search ......... 310/363–366, 310/328
See application file for complete search history.

(56) References Cited

U.S. PATENT DOCUMENTS

| | | | | |
|---|---|---|---|---|
| 3,281,613 A | * | 10/1966 | Hatschek | 310/338 |
| 3,349,259 A | * | 10/1967 | Kistler | 310/338 |
| 3,390,287 A | * | 6/1968 | Sonderegger | 310/329 |
| 4,523,121 A | * | 6/1985 | Takahashi et al. | 310/334 |
| 4,667,127 A | * | 5/1987 | Krempl et al. | 310/338 |
| 4,932,119 A | | 6/1990 | Ealey et al. | |
| 5,875,099 A | * | 2/1999 | Maesaka et al. | 361/760 |
| 6,114,798 A | * | 9/2000 | Maruyama et al. | 310/323.06 |
| 6,121,858 A | * | 9/2000 | Yamamoto et al. | 333/189 |
| 2003/0015944 A1 | * | 1/2003 | Schober et al. | 310/366 |
| 2005/0231074 A1 | * | 10/2005 | Iwase et al. | 310/328 |
| 2005/0275318 A1 | * | 12/2005 | Maruyama et al. | 310/366 |
| 2006/0138908 A1 | * | 6/2006 | Iwase et al. | 310/366 |

* cited by examiner

*Primary Examiner*—Jaydi SanMartin
(74) *Attorney, Agent, or Firm*—Iandiorio Teska & Coleman

(57) ABSTRACT

An actuator for a deformable optical component includes a stack of ferroelectric layers, a plurality of electrodes for applying a voltage across each layer; every other electrode extending to an associated first conductor path and interstitial electrodes extending to an associated second conductor path the first conductor path or receiving a first conductor lead, the second conductor path for receiving a second conductor lead to contact the respective electrodes.

18 Claims, 10 Drawing Sheets

ACTUATOR FOR DEFORMABLE OPTICAL COMPONENT

FIELD OF THE INVENTION

This invention relates to an improved actuator for a deformable optical component.

BACKGROUND OF THE INVENTION

High authority deformable mirrors, that is, deformable mirrors with high stroke and high frequency operate well into the Greenwood frequency range of 250 Hz at strokes of 10 micron. However, when operating in high scintillation conditions the adjustment or actuation of the surface normal actuators is required into much higher frequency. The actuators are formed from a plurality of segments made, for example, from electrodisplacive material and separated from each other by electrodes. This increase in frequency results in much higher current, i, in accordance with the fundamental condition that $$i = c\frac{dv}{dt}$$

where c is the capacitance of the actuator, v the voltage applied to it and dt represents the decreasing time with increased frequency. This higher current has resulted in actuator burnout due to hot spots, especially where the lead wires connect to the conductive epoxy film which acts as the connector to each of the electrodes. Increasing the conductivity of the epoxy is not a solution because there is a limit to the amount and particle size of the conductive material, e.g. silver that can be added to the epoxy. Other forms of connection such as platinum ink or solder ribbons, see U.S. Pat. No. 4,932,119, suffer similar problems and increasing their thickness would significantly increase the space and reduce the packing density obtainable with the actuator.

BRIEF SUMMARY OF THE INVENTION

It is therefore an object of this invention to provide an improved actuator for a deformable optical component.

It is a further object of this invention to provide such an improved actuator for a deformable optical component which eliminates hot spots that can burn out the actuator.

It is a further object of this invention to provide such an improved actuator for a deformable optical component which can operate at higher frequency and current.

It is a further object of this invention to provide such an improved actuator for a deformable optical component which can operate at higher frequency and current up to the natural frequency of the stack and peak currents in excess of 2 amperes.

It is a further object of this invention to provide such an improved actuator for a deformable optical component which is smaller diameter and admits of higher packing density.

It is a further object of this invention to provide such an improved actuator for a deformable optical component which reduces inactive ceramic area.

It is a further object of this invention to provide such an improved actuator for a deformable optical component which has more gain sensitivity or stroke per unit electric field applied.

It is a further object of this invention to provide such an improved actuator for a deformable optical component which admits of a redundant electrodes.

The invention results from the realization that an improved, actuator without burnout can be effected with a stack of ferroelectric layers, and a plurality of electrodes for applying a voltage across each layer; every other electrode extending to an associated first conductor path or channel and the interstitial electrodes extending to an associated second conductor path or channel, the first and second paths or channels being aligned, respectively, for receiving first and second conductor leads or wires to connect to respective electrodes.

The subject invention, however, in other embodiments, need not achieve all these objectives and the claims hereof should not be limited to structures or methods capable of achieving these objectives.

This invention features an actuator for a deformable optical component including a stack of ferroelectric layers, each layer having first and second recesses. There are a plurality of electrodes for applying a voltage across each layer. Every other electrode extends to an associated first recess and interstitial electrodes extend to an associated second recess. The first recesses are aligned to form in the stack a first recess channel for receiving a first buried conductor and the second recesses are aligned to form in the stack a second recess channel for receiving a second buried conductor to contact the respective electrodes.

This invention also features an actuator for a deformable optical component including a stack of ferroelectric layers and a plurality of electrodes for applying a voltage across each layer. Every other electrode extends to an associated first conductor path and interstitial electrodes extend to an associated second conductor path. The first conductor path receives a first conductor lead and the second conductor path receives a second conductor lead to contact the respective electrodes In a preferred embodiment the actuator may be a surface normal actuator. The ferroelectric layers may include electrostrictive material, piezoelectric material, piezorestrictive material, pyroresistive material, magnetorestrictive material, lead magnesium niobate. Ferroelectric layers may include, for example, electrostrictive material, piezoelectric material, piezorestrictive material, pyroresistive material, magnetorestrictive material, lead magnesium niobate. There may be a supplemental conductive film covering the buried electrode to provide redundant connectors. The actuator may be a cylindrical prism. The channels and conductors may be straight, curved, semi-circular in cross section, square in cross section, or triangular in cross section. There may be more than two channels and conductors. The channels and conductors may be disposed diametrically opposite on the actuator. The conductor leads may be bonded to the stack channels or paths and electrically connected to the electrodes by a conductive adhesive.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
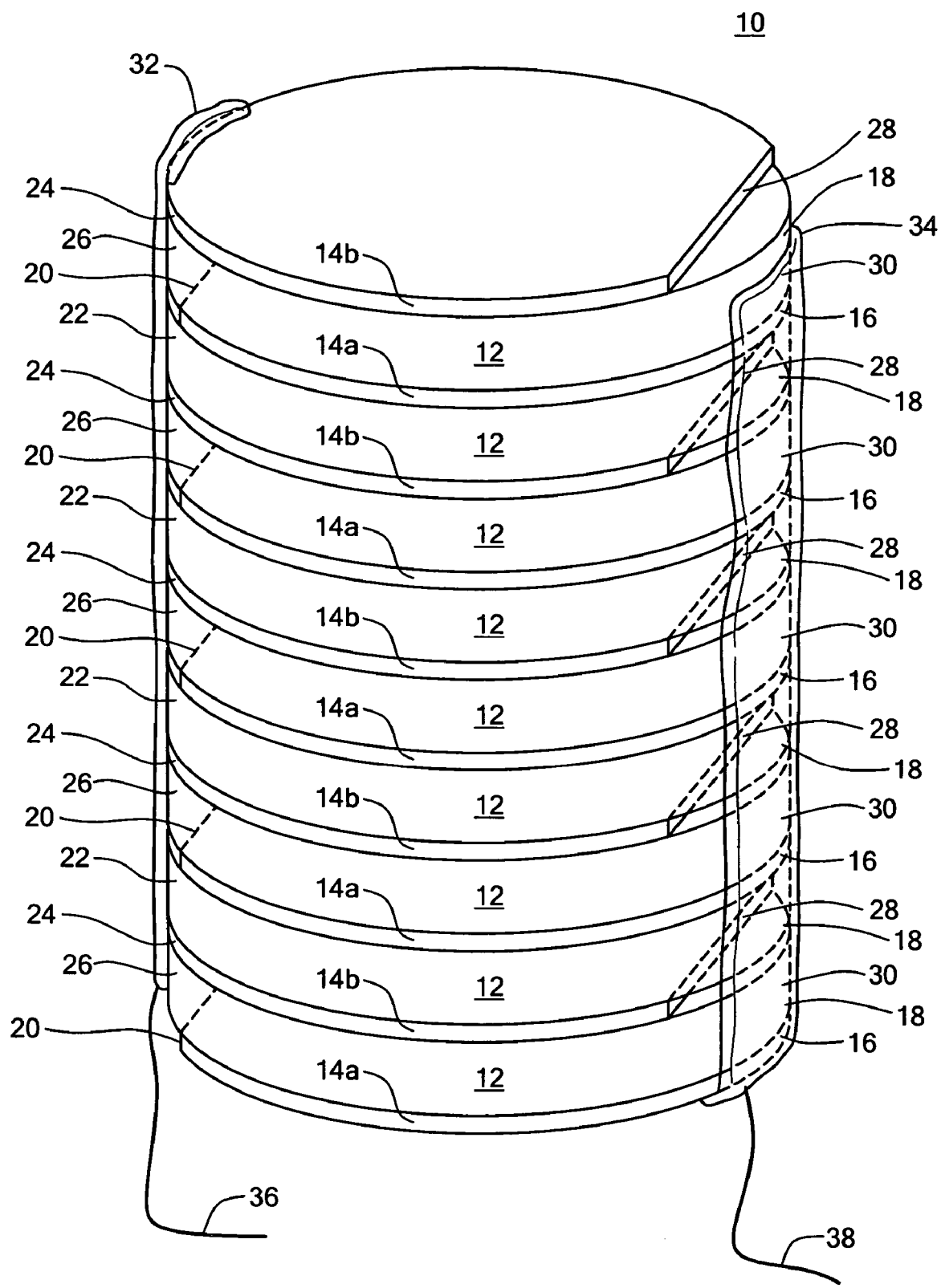
FIG. 1 is a three dimensional schematic view of a prior art surface normal actuator.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
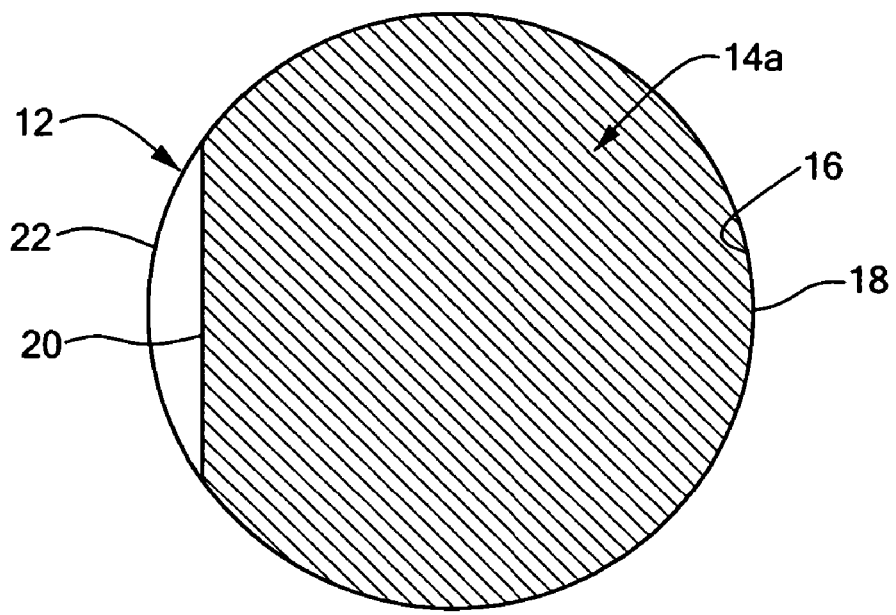
FIG. 2 is a schematic top plan view of a right-hand electrode on a ferroelectric layer of FIG. 1.

There is shown in FIG. 1 a prior art surface normal actuator including a plurality of ferroelectric layers actuator 10 including a plurality of ferroelectric layers 12 separated by a plurality of electrodes. Every other electrode 14a is a right hand electrode while the interstitial electrodes 14b are left hand electrodes. Right hand electrodes 14a, FIG. 2, are so called because their right hand boundary 16 extends to and is coincident with the right hand edge 18 of the associated ferroelectric layers 12, while the left hand boundary 20 extends short of the left-hand edge 22 of ferroelectric layer 12.

Figure 3:
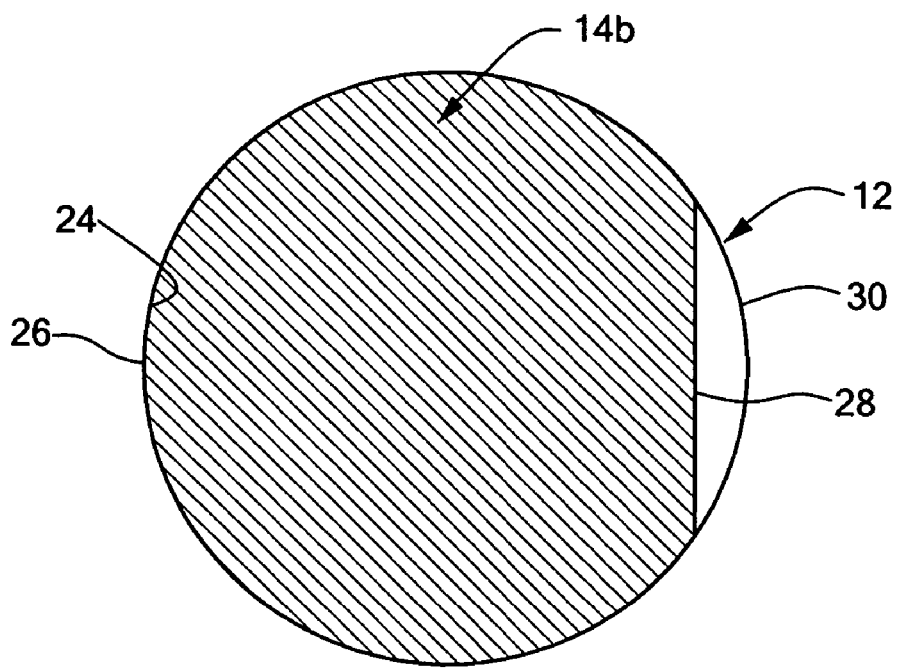
FIG. 3 is a schematic top plan view of a left-hand electrode on a ferroelectric layer of FIG. 1.

In contrast left hand electrodes 14b, FIG. 3, have their left hand boundary 24 extending coincident with the left edge 26 of associated ferroelectric layers 12 while the right hand boundary 28 stops short of the right hand edge 30 of the associated layers 12.

Referring again to FIG. 1, it can be seen that the electrodes 14a are disposed between alternate ferroelectric layers 12 while the left hand electrodes 14b are between the interstitial layers 12. In this prior art device the connectors to these electrodes are layers of epoxy 32, 34 which because of the geometry of the right hand 14a and left hand 14b electrodes contact only one or the other. For example, connector 32 connects with all of the left-hand electrodes 14b while connector 34 engages with only right hand electrodes 14a. The voltage applied to connectors 32 and 34 is provided over leads 36 and 38. One of the problems with this approach is that the epoxy layers 32, 34 extend out beyond the body of actuator 10 and cause it to require that much more space which reduces the packing density. More importantly the epoxy layer or other film can only be made conductive to a certain extent due to practical limitations. As a result during high current demands as explained in the Background of Invention, supra, burnout will occur at hot spots along the connectors 32 and 34.

Figure 4:
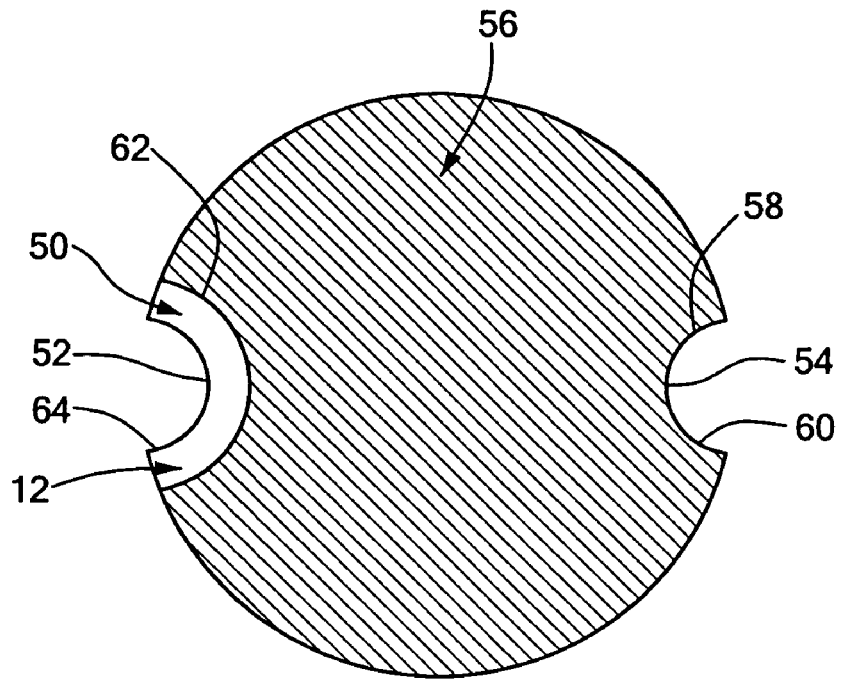
FIG. 4 is a schematic top plan view of a right-hand electrode on a ferroelectric layer of FIG. 1 according to this invention.
Figure 5:
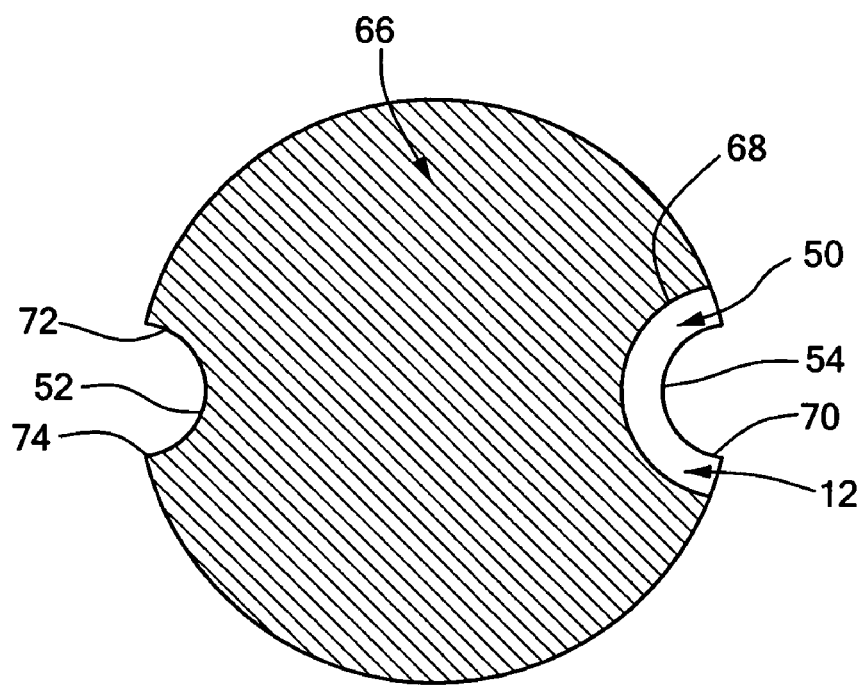
FIG. 5 is a schematic top plan view of a left-hand electrode on a ferroelectric layer of FIG. 1 according to this invention.
Figure 6:
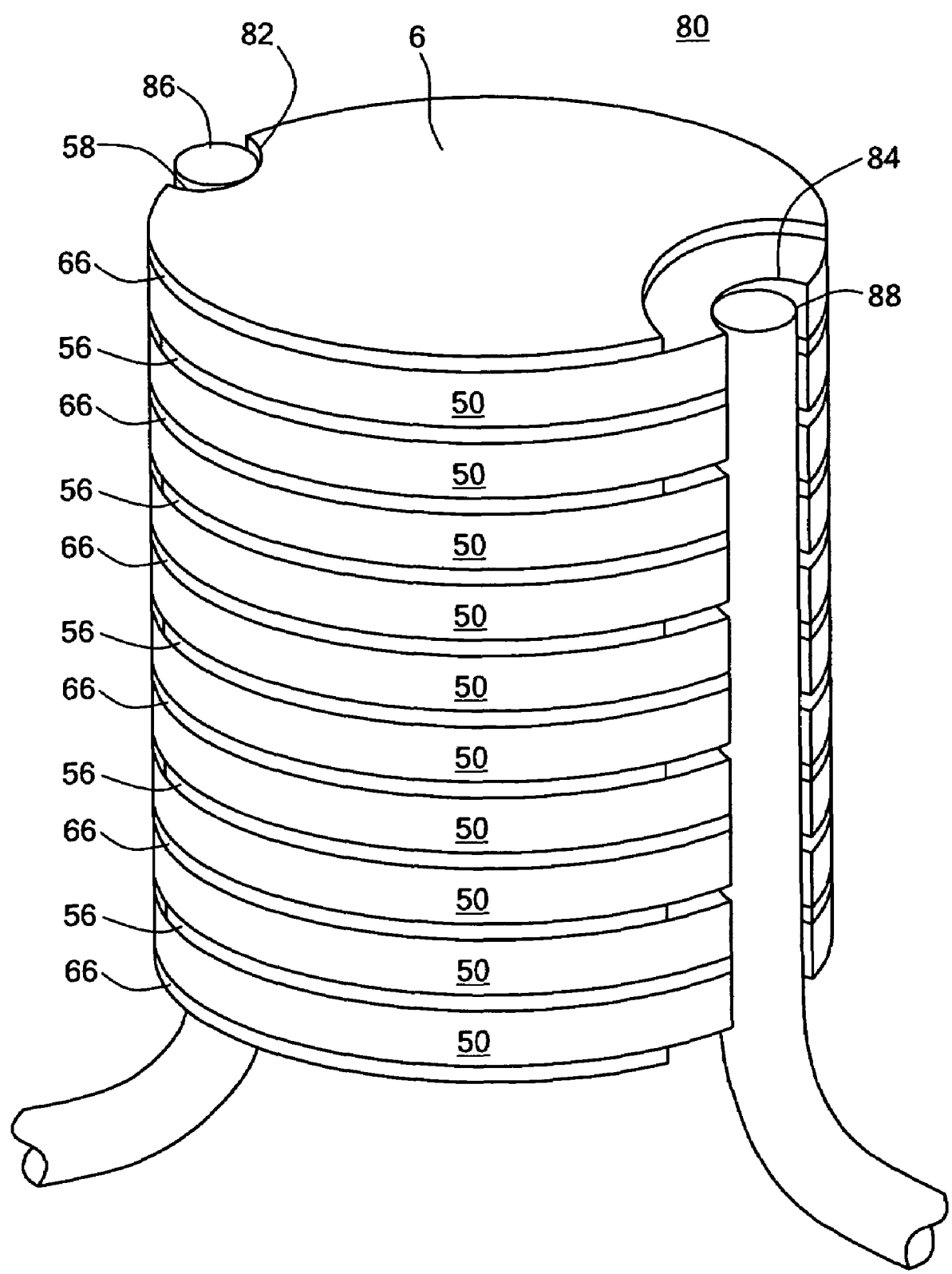
FIG. 6 is a three dimensional schematic front view of a surface normal actuator according to this invention using electrodes and layers as shown in FIGS. 4 and 5.
Figure 7:
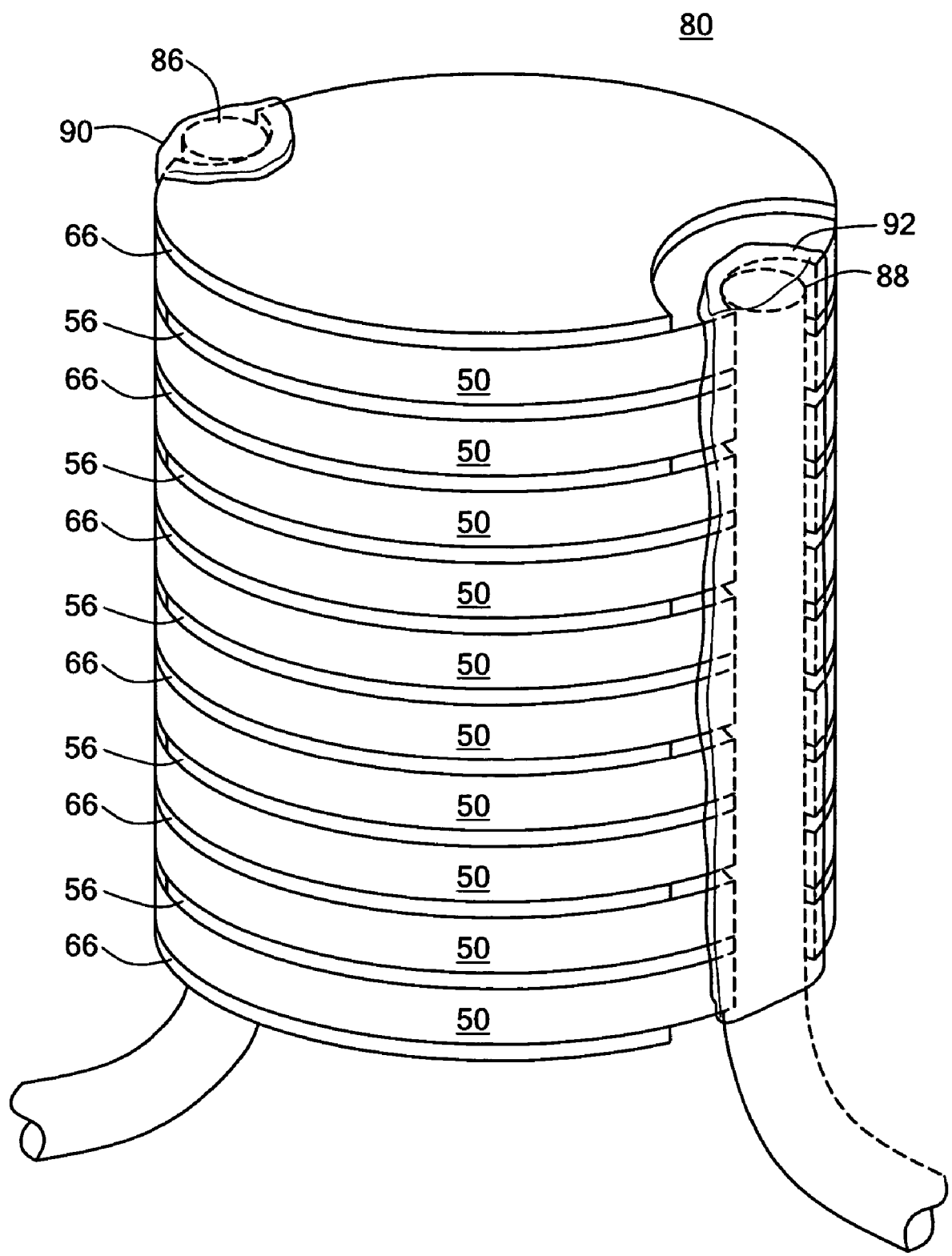
FIG. 7 is a side view of the actuator of FIG. 6.

In accordance with this invention each of the ferroelectric layers 50, FIGS. 4 and 5, includes a recess 52, 54. Right hand electrode 56, FIG. 4, has its right hand boundary 58 extend to and coincident with edge 60 at recess 54 of layer 50 but its left hand boundary 62 stops short of the edge 64 at recess 52. In contrast left-hand electrode 66, FIG. 5, has its right hand boundary 68 stop short of right hand edge 70 at recess 54 of layer 50, while the left hand boundary 72 of electrode 66 extends coincident with boundary 74 at recess 52 of layer 50. By aligning these recesses 52 and 54 of layers 12 and aligning right hand 56 and left-hand 66 electrodes accordingly as shown in FIGS. 4 and 5, an actuator 80, FIG. 6, can be constructed which includes recessed channels 82 and 84 into which can be disposed conductors 86 and 88. Conductors 86 and 88 can be leads or wires instead of conductive adhesive mediums and can be made of copper wire, for example, AWG 28, 30 or 32 gauge. Conductors 86 and 88 are much more robust and capable of conducting much greater current then films or epoxy layers to form connectors with electrodes 56 and 66 and at the same time they are within the confines of the shape of actuator stack 80. The more robust cross-section and conductivity of conductors 86 and 88 eliminates the problem of hot spots occurring which could burn out actuator 80. In addition a desired redundant electrode can be constructed as shown in FIG. 7 by simply layering another conductive film or conductive epoxy 90 and 92 on top of conductors 86 and 88, respectively.

Figure 8:
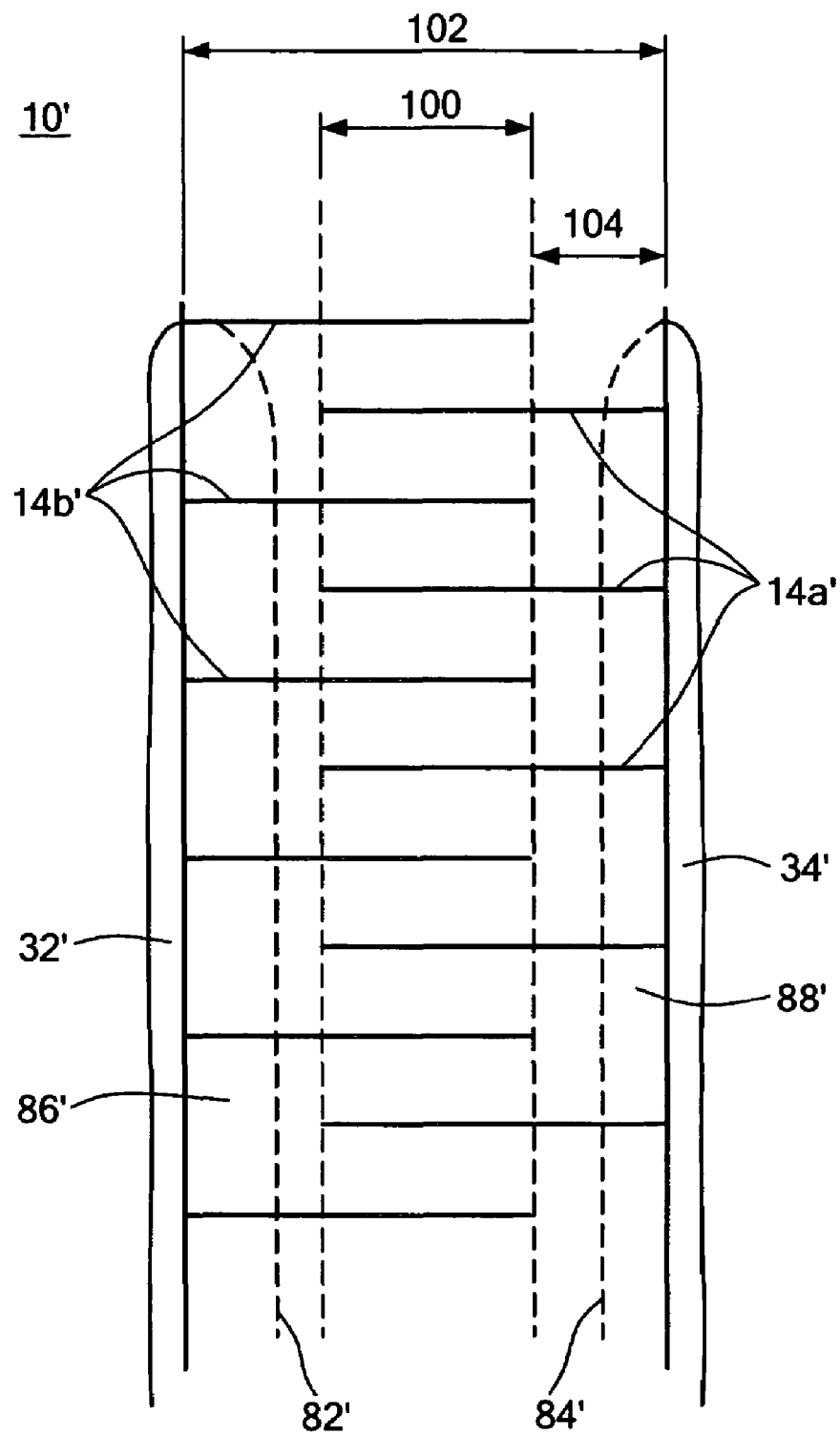
FIG. 8 is a schematic sectional view of the actuator of FIGS. 6 and 7 illustrating the increased sensitivity obtainable with this invention.

Another advantage of this invention is that the recessed channels reduce the inactive area with respect to the active area: increased ratio of active area to inactive area results in more stroke per unit of applied electric field and this in turn produces better gain sensitivity. This is illustrated diagrammatically in FIG. 8, where a typical prior art actuator 10' is shown with right hand electrodes 14a' and left hand electrodes 14b'. For purposes of this explanation it can be seen that the active area 100 is defined as the area where the left hand and right hand electrodes overlap. The total area 102 is simply the total area of the actuator 10'. Subtracting the active area from the total area gives the inactive area 104, that is, the stack area where the electrodes do not overlap one another. When the conductors 32' and 34' of the prior art are replaced by the connectors 86' and 88' in channels 82' and 84' that inactive area 104 is reduced. Thus the ratio of active to inactive area is improved so that there is more stroke per unit of applied electric field and better gain sensitivity with the present invention as compared to the prior art.

Figure 10:
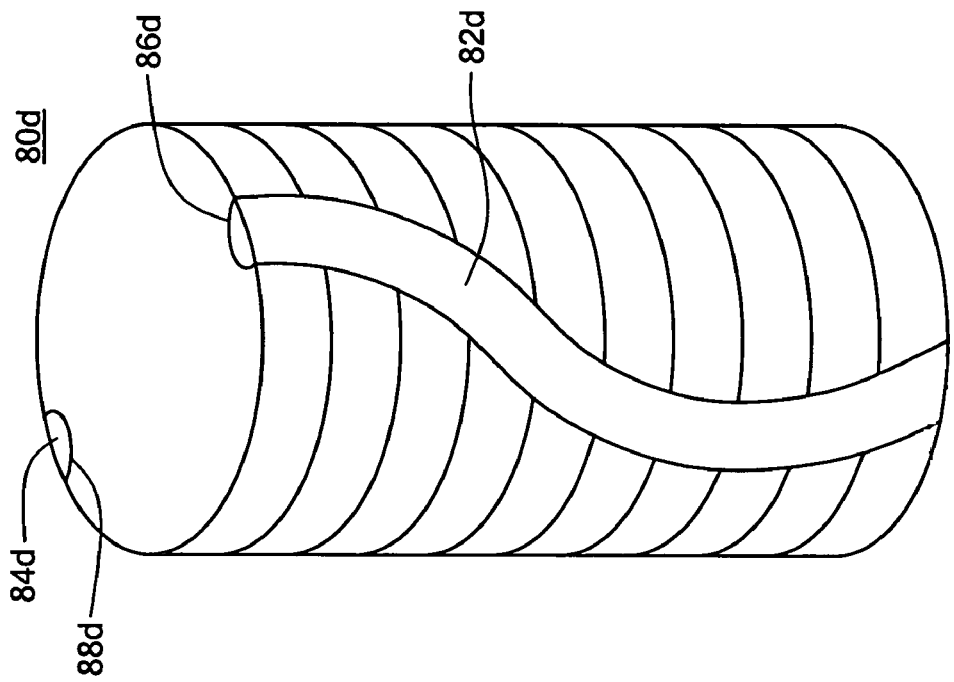
FIG. 10 is a schematic three-dimensional view illustrating one example of the alternative shapes that the channels and conductors can assume.
Figure 9:
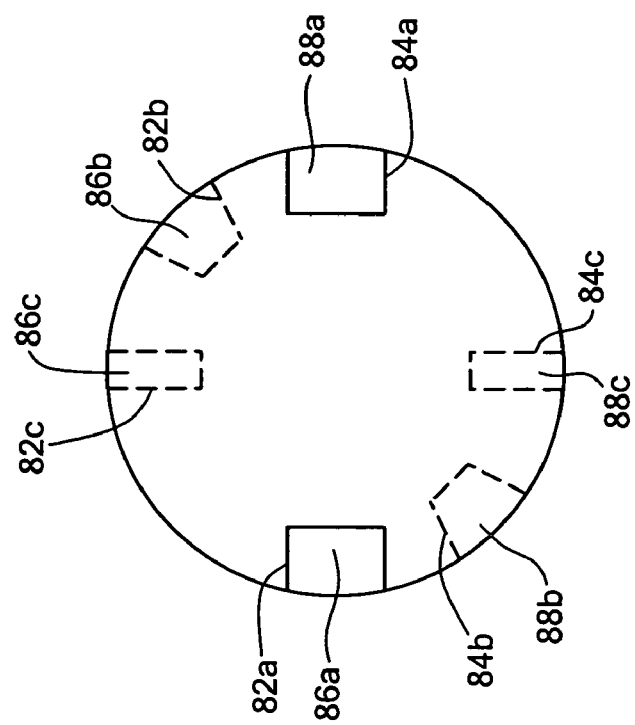
FIG. 9 is a schematic plan view illustrating a few of the shapes that can be used for the channels and conductors of the actuator.
Figure 12:
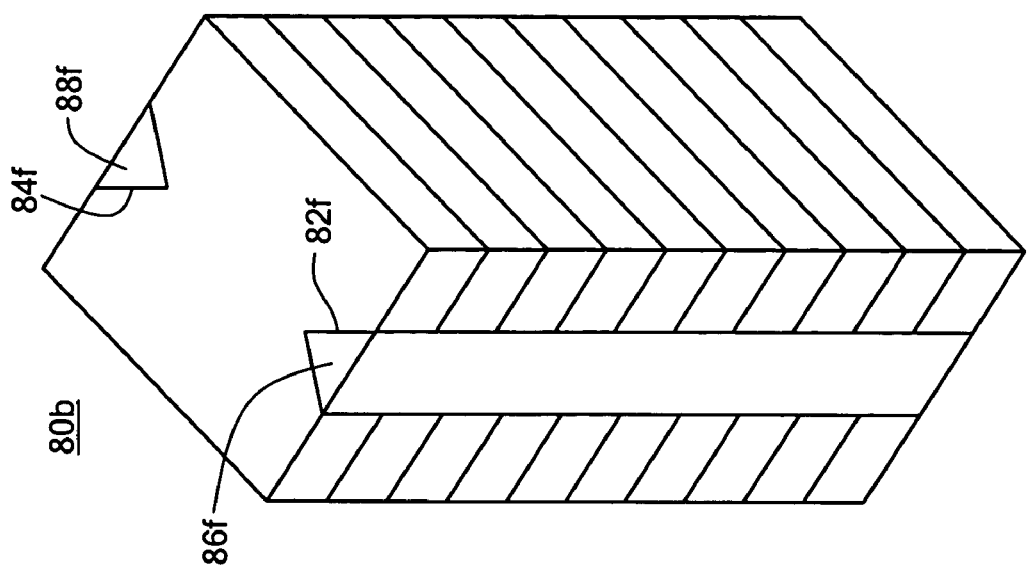
FIG. 12 is a schematic three dimensional view illustrating one example of the different shapes the actuator can assume and demonstrating another shape for the channel and conductors.
Figure 11:
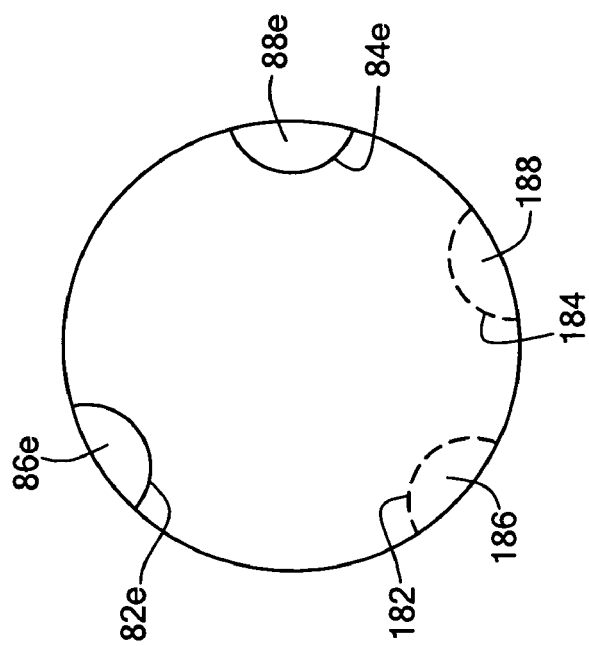
FIG. 11 is a schematic plan view illustrating a few of the different placements for the channels and conductors about the actuator.

Although conductors 86 and 88 and their recessed channels 82 and 84 are shown as having a generally semi-circular cross section this is not a necessary limitation of the invention as the channels 82, 84 and conductors 86, 88 can be any shape: square 86a, 88a, FIG. 9, polygonal 86b, 88b, rectangular 86c, 88c. Also, although the channels are shown in a vertical straight line, this too is not a limitation of the invention: by simply rotating some of the layers 50 and electrodes 56, 66, channels 82d and 84d, FIG. 10, could define a curved line, a serpentine line, an inclined line or any desired shape path. Further, although recesses 52 and 54 are shown as diametrically opposed this, too, is not a limitation of the invention: so long as they are separated from each other sufficiently to provide electrical isolation for the alternating electrodes any position is sufficient. In FIG. 11 channels 82e, 84e and conductors 86e, 88e are at 120°. FIG. 11 also illustrates that the number of channels and conductors is not limited to two or three or any number: see additional channels 182, 184, conductors 186, 188. While the stack is shown as a cylindrical prism, this is not a necessary limitation of the invention, as it may take any form as in FIG. 12 where the actuator 80b stack is a rectangular prism with triangular channels 82f, 84f and conductors 86f, 88f.

Figure 13:
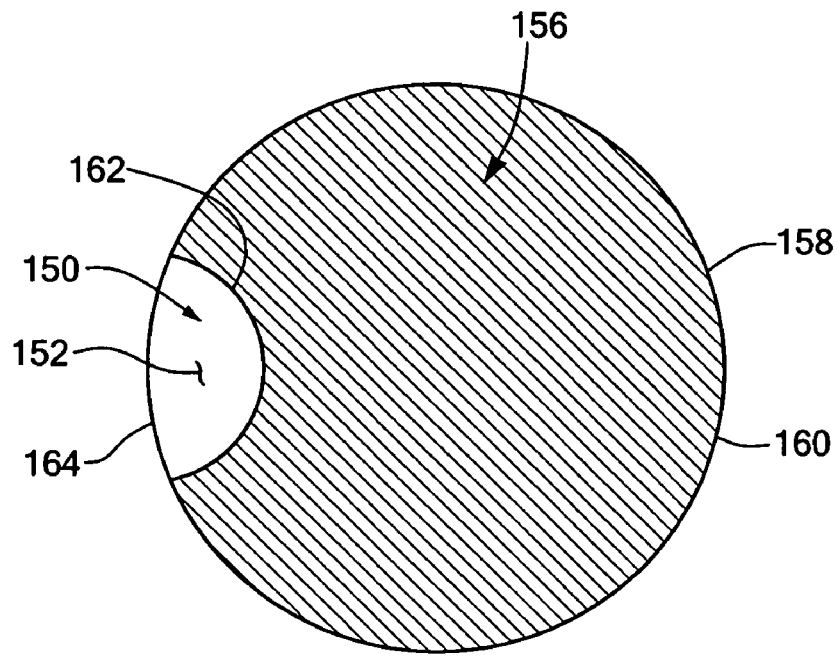
FIG. 13 is a view of a layer and right hand electrode similar to that of FIG. 4 without recesses to form channels.
Figure 14:
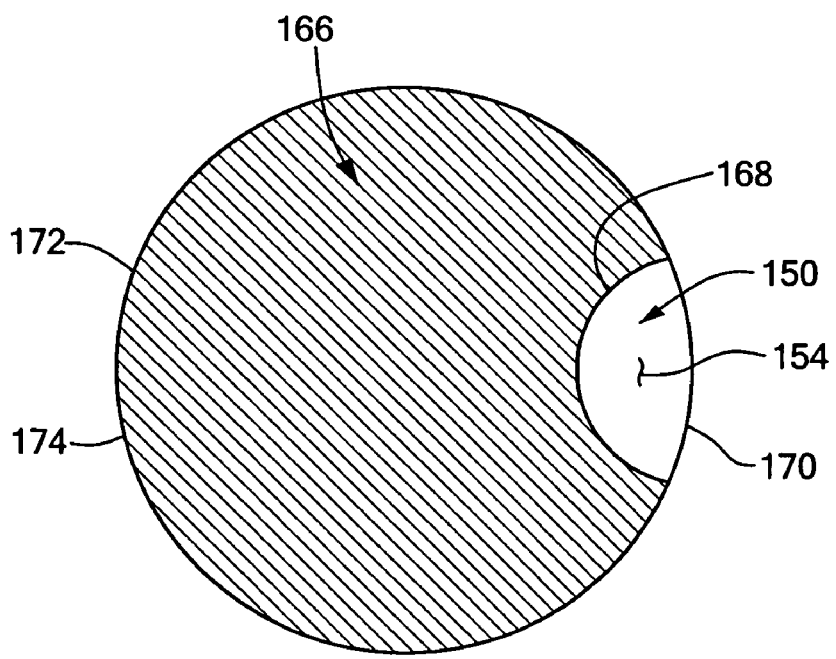
FIG. 14 is a view of a layer and left hand electrode similar to that of FIG. 5 without recesses to form channels.
Figure 15:
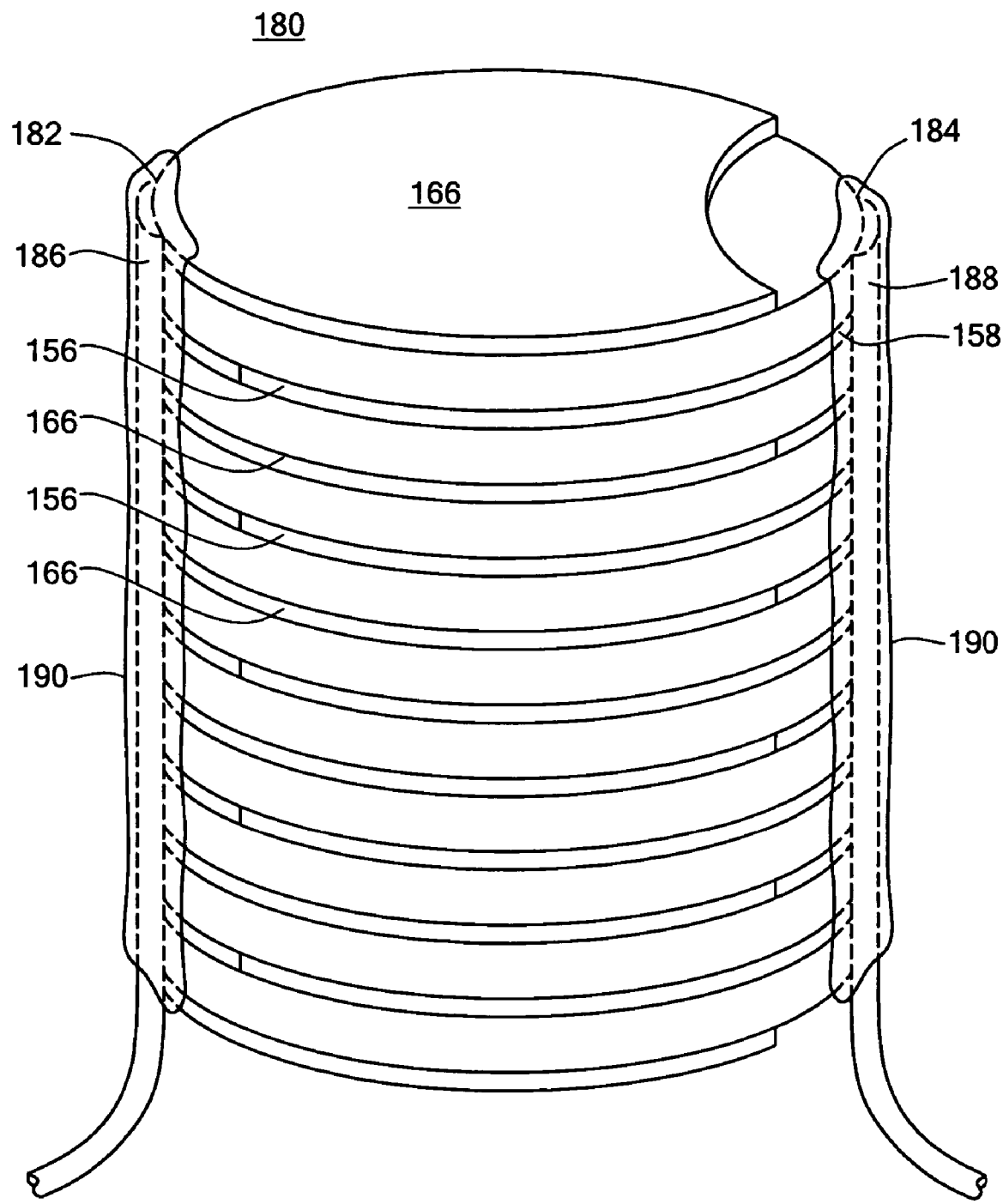
FIG. 15 is a view similar to that of FIG. 6 of a surface normal actuator using the electrodes and layers of FIGS. 13 and 14 with conductor paths instead of channels to receive the conductor leads.

In accordance with another embodiment of this invention the ferroelectric layers 150, FIGS. 13 and 14, are separated by right and left hand electrodes. Right hand electrode 156, FIG. 13, has its right hand boundary 158 extend to and coincident with edge 160 of layer 150 but its left hand boundary 162 stops short of the edge 164 of layer 150. In contrast left-hand electrode 166, FIG. 14, has its right hand boundary 168 stop short of right hand edge 170 of layer 150, while the left hand boundary 172 of electrode 166 extends coincident with boundary 174 of layer 150. The recesses 152, 154 are thus formed in each electrode 156 and 166. By aligning these recesses 152 and 154 of electrodes 156 and 166, an actuator 180, FIG. 15, can be constructed which includes conductor paths 182 and 184 on or at which can be disposed conductor leads or wires 186 and 188. Conductors 186 and 188 can be made of copper wire, for example, AWG 28, 30 or 32 gauge. Conductors 186 and 188 are much more robust and capable of conducting much greater current then films or epoxy layers to form connectors with electrodes 156 and 166. A conductive epoxy 190 may be used to bond conductors 186, 188 to the stack as well as electrically connect them to each of the electrodes 156, 166. Here an epoxy conductor doesn't contribute to burn-out because the epoxy conductor only conducts the small current required for each electrode at the contact part rather than the total current for all electrodes as when it was the main conductor in the prior art.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An actuator for a deformable optical component comprising:
a stack of ferroelectric layers, each layer having first and second recesses extending inward from the outer edge of said layer; a plurality of electrodes for applying a voltage across each layer; every other electrode extending to an associated said first recess and interstitial electrodes extending to an associated said second recess; said first recesses being aligned to form in the stack a first recess channel for receiving a first buried conductor and said second recesses being aligned to form in the stack a second recessed channel for receiving a second buried conductor to contact the respective electrodes.

2. The actuator of claim 1 in which said actuator is a surface normal actuator.

3. The actuator of claim 1 in which said ferroelectric layers include electrostrictive material.

4. The actuator of claim 1 in which said ferroelectric layers include piezoelectric material.

5. The actuator of claim 1 in which said ferroelectric layers include piezorestrictive material.

6. The actuator of claim 1 in which said ferroelectric layers include pyrorestrictive material.

7. The actuator of claim 1 in which said ferroelectric layers include magnetorestrictive material.

8. The actuator of claim 1 in which said ferroelectric layers include lead magnesium niobate.

9. The actuator of claim 1 further including a supplemental conductive film covering the buried electrode to provide redundant connectors.

10. The actuator of claim 1 in which said actuator is a cylindrical prism.

11. The actuator of claim 1 in which said channels and conductors are straight.

12. The actuator of claim 1 in which said channels and conductors are curved.

13. The actuator of claim 1 in which said channels and conductors are semi-circular in cross section.

14. The actuator of claim 1 in which said channels and conductors are square in cross section.

15. The actuator of claim 1 in which said channels and conductors are triangular in cross section.

16. The actuator of claim 1 in which there are more than two channels and conductors.

17. The actuator of claim 1 in which said channels and conductors are disposed diametrically opposite on said actuator.

18. The actuator of claim 1 in which said conductor leads are bonded to said stack along said channels and are electrically connected to said electrodes by a conductive adhesive.

* * * * *